United States Patent [19]
Komano et al.

[11] Patent Number: 5,083,033
[45] Date of Patent: Jan. 21, 1992

[54] METHOD OF DEPOSITING AN INSULATING FILM AND A FOCUSING ION BEAM APPARATUS

[75] Inventors: Haruki Komano; Toshihiko Hamasaki, both of Yokohama; Tadahiro Takigawa, Kawasaki, all of Japan

[73] Assignee: Kabushiki Kaisha Toshiba, Kawasaki, Japan

[21] Appl. No.: 500,302

[22] Filed: Mar. 28, 1990

[30] Foreign Application Priority Data

Mar. 31, 1989 [JP] Japan .................................. 1-786609
Aug. 23, 1989 [JP] Japan .................................. 1-214864
Dec. 12, 1989 [JP] Japan .................................. 1-320638

[51] Int. Cl.$^5$ ............................................. H01J 37/30
[52] U.S. Cl. .................................... 250/492.2; 427/38
[58] Field of Search ............... 250/492.21, 492.2; 427/38

[56] References Cited

U.S. PATENT DOCUMENTS 4,363,828 12/1982 Brodsky et al. .................. 427/39
4,664,937 5/1987 Oushinsky et al. .............. 437/2
4,868,068 9/1989 Yamaguchi et al. ............. 427/38

FOREIGN PATENT DOCUMENTS 63-25660 5/1988 Japan .

OTHER PUBLICATIONS

Ward et al., "Microcircuit Modification Using Focused Ion Beams," Proc. SPIE Int. Soc. Opt. Eng. 923, 1988, 92.

Hiura et al., "Localized Insulating Technique Using a SiO2 Film Deposited by Laser CVD," Proc. Autumn Meeting of the Japan Society of Applied Physics, Kanazawa, Oct. 1988, p. 534.

*Primary Examiner*—Bruce C. Anderson
*Attorney, Agent, or Firm*—Foley & Lardner

[57] ABSTRACT

Disclosed is a focusing ion beam apparatus, comprising an ion source, focusing and deflecting means for focusing and deflecting an ion beam obtained by the ion source, and a plurality of gas introducing means for a plurality of gases to be supplied onto the surface of a sample to deposit an insulating film. According to the apparatus, a silicon compound gas and a gas mainly consisting of an element other than silicon as a plurality of the gases are supplied onto the surface of the sample, then the ion beam obtained from the ion source is irradiated onto the gases. Thereby, the gases are decomposed so that an insulating film consisting of a silicon oxide or a silicon nitride is deposited on a desired oxide or a silicon nitride is deposited on a desired position of the surface of the sample.

22 Claims, 6 Drawing Sheets

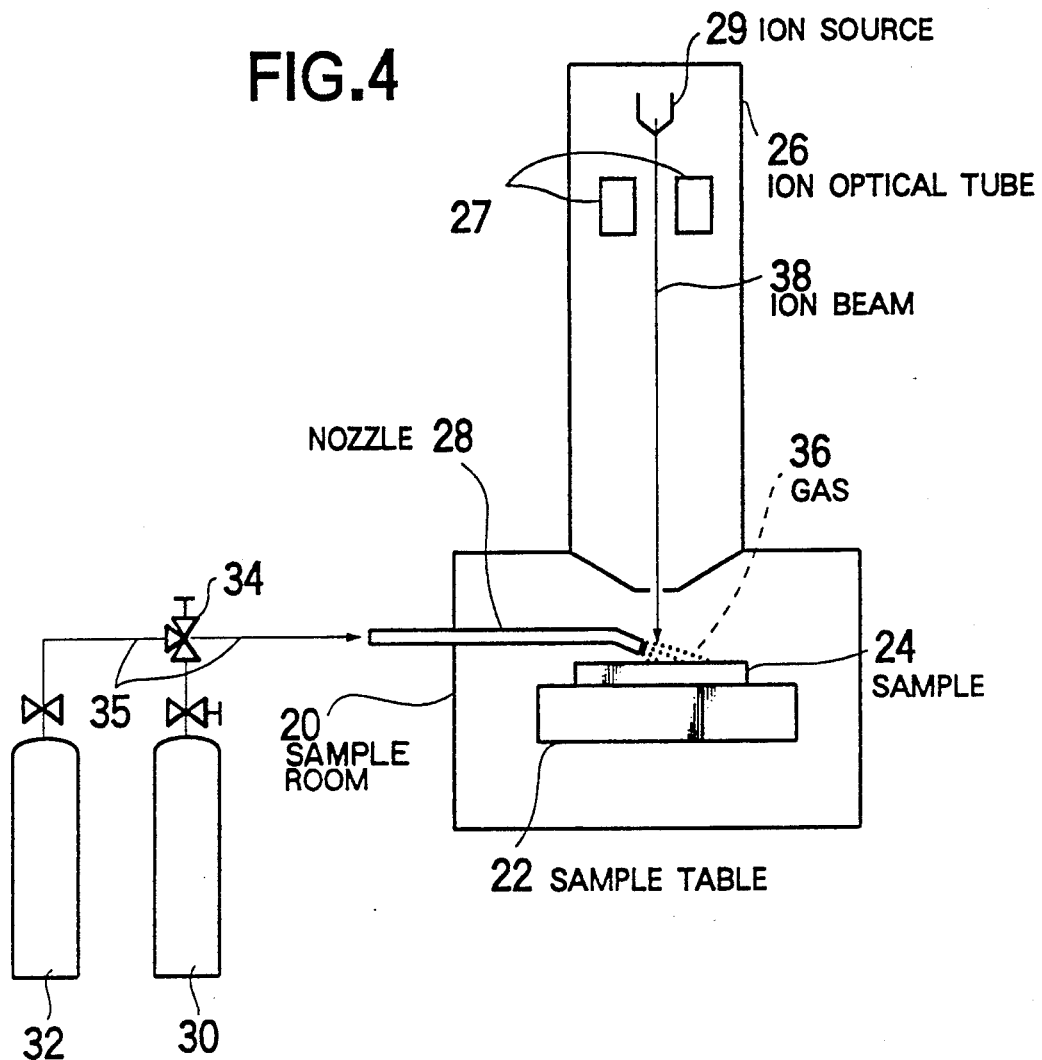
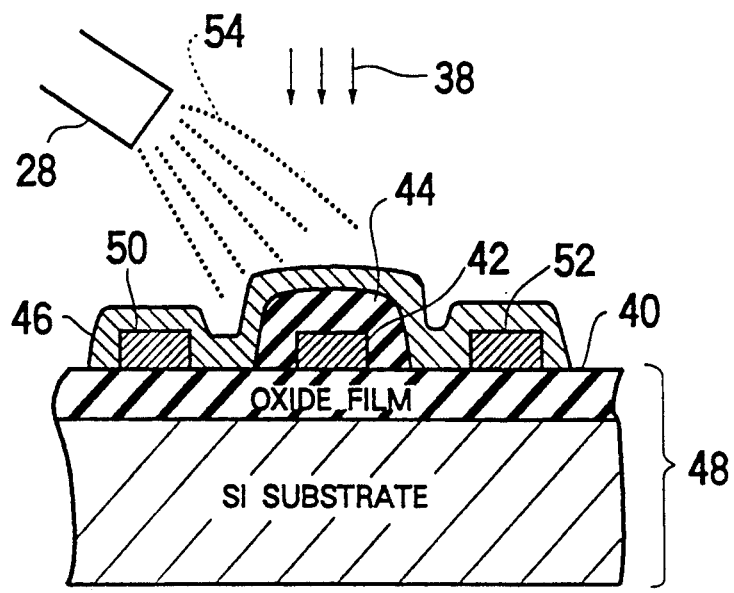

METHOD OF DEPOSITING AN INSULATING FILM AND A FOCUSING ION BEAM APPARATUS

BACKGROUND OF THE INVENTION

1. Field of the Invention

The present invention relates to a method of depositing an insulating film for forming an insulating film at a predetermined portion of a semiconductor device, at a focusing ion beam apparatus to be used in the method of depositing an insulating film.

2. Description of the Prior Art

On development of a semiconductor device, an operational check or a defective analysis of the device is essential. In such a case, it is necessary for the check to cut a part of wires to separate a part of a circuit or connect wires not connected to each other in a circuit. Recently a semiconductor has been highly integrated, and the minimum width or interval of the wire of the semiconductor device is now about 1 μm. Thus, a fine process technology of a submicron unit is required to realize the process of cutting or connecting the wires.

Therefore, a focusing ion beam (hereinafter, called FIB) for performing a fine process of a submicron unit is recently used for the purpose. Also, an FIBIC repair apparatus for cutting or connecting the wires is sold on the market. Specifically, the FIBIC repair apparatus cuts the wires by sputter etching of, for example, a Ga (gallium) ion beam.

FIG. 1 is a schematic compositional diagram of a conventional focusing ion beam apparatus. In the same diagram, reference numeral 3 designates an ion optical tube in which a liquid metal ion source 1 for generating a focused ion beam 2 of Ga or the like is disposed. The beam 2 is irradiated on a sample placed in a sample room 4 directly facing the ion source 1 through a mass separator 6. Further, reference numeral 8 designates a table on which the sample 9 is placed. From a gas nozzle 5 disposed in the sample room 4, a gas 10 of a tungsten carbonyl (W(CO)$_6$) or the like is jetted onto the sample 9. Then, the gas is decomposed by the ion beam 2, so that a deposition film of tungsten or the like is formed on the sample 9. Additionally, reference numerals 7a, 7b respectively designate an opening and closing valve and a gas cylinder.

FIG. 2 is a cross section of an insulating film to be obtained by the conventional focusing ion beam apparatus and method of depositing an insulating film. In the conventional method of depositing an insulating film, the gallium (Ga) ion beam 2 is irradiated on the sample 9 in the state that a tungsten carbonyl (W(CO)$_6$) gas 11 is supplied to the sample 9 from the nozzle 5 disposed in the sample room 4. Thereby, the W(CO)$_6$ gas is decomposed, and the resultant tungsten (W) is deposited on the sample 9. Accordingly, a tungsten (W) wire can be formed on the sample 9 by irradiating the Ga ion beam on a desired area to connect between desired wires 12, 13.

However, in such a conventional method of depositing insulating film and a focusing ion beam apparatus, when a naked wire 17 is present between wires 15 and 16 to be connected to each other, the naked wire 17 should be coated by an insulating film before the wires 15 and 16 are connected. Conventionally, in such a case, the check was given up, or the wire 17 was coated with an insulating film in another process before the connection between the wires 15 and 16 by the conventional method. Accordingly, much time is required for the check if it be actually done, so that it is difficult to perfectly carry out the defective analysis and the operational check on a semiconductor device by the conventional method of depositing an insulating film and focusing ion beam apparatus.

SUMMARY OF THE INVENTION

The present invention is intended to solve the problem in the prior art, therefore it is an object to provide a focusing ion beam apparatus and a method of depositing an insulating film using it, which can easily deposit an insulating film onto an optional portion when deposition of the insulating film is required on the defective analysis and the operational check of a transistor device.

To achieve the above object, a focusing ion beam apparatus according to the present invention comprises a sample room for placing a sample therein, an ion source to be used for deposition of an insulating film on the surface of the sample, focusing and deflecting means for focusing and deflecting an ion beam generated from the ion source so as to irradiate the ion beam onto a predetermined portion of the surface of the sample, and a gas introducing means for introducing a plurality of gases to be supplied onto the surface of the sample from the respective supply source.

Particularly, a focusing ion beam apparatus which will be shown below as a third embodiment further comprises high-frequency discharge means as a part of the gas introducing means for activating the gases to be supplied onto the sample through the gas introducing means.

While, a method of depositing an insulating film on the surface of a sample according to the present invention is characterized by comprising a step of supplying a first gas consisting of a silicon compound onto the surface of the sample under vacuum, a step of supplying a second gas mainly consisting of an element other than silicon onto the surface of the sample, and a step of reacting the first and the second gas by irradiating an ion beam obtained from an ion source including an element for composing the insulating film onto the surface of the sample, thereafter depositing the resultant silicon compound insulating film on the surface of the sample.

Particularly, a method of depositing an insulating film which will be shown below as a fourth embodiment is characterized in that a radical of a silicon compound is supplied as the first gas in the step of supplying the first gas, and a radical of a gas mainly consisting of an element other than silicon is supplied as the second gas in the step of supplying the second gas.

These and other objects, features and advantages of the present invention will be more apparent from the following description of a preferred embodiment taken in conjunction with the accompanying drawings.

BRIEF DESCRIPTION OF THE DRAWINGS

FIG. 4 is a compositional diagram of a focusing ion beam apparatus which is a first embodiment of the present invention, FIG. 5 is a cross section of a semiconductor device obtained by using the focusing ion beam apparatus shown in FIG. 4.

DETAILED DESCRIPTION OF THE EMBODIMENTS

Figure 1:
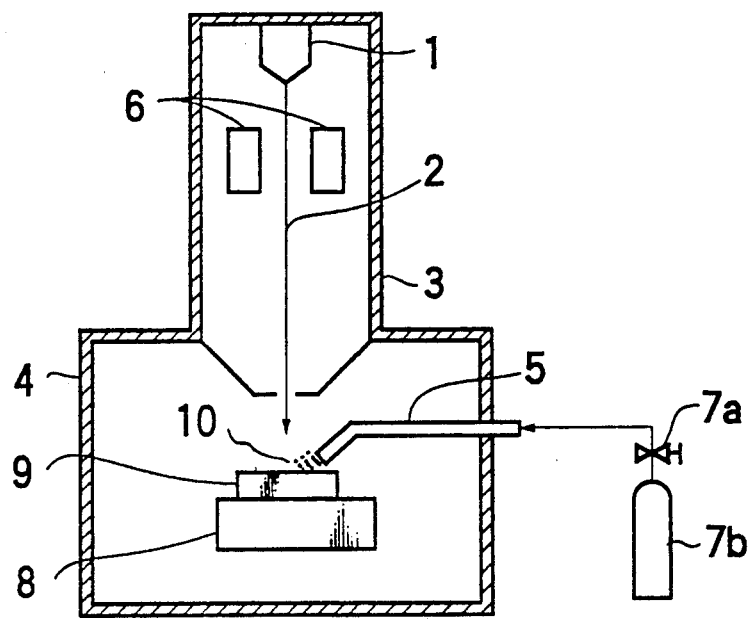
FIG. 1 is a compositional diagram of a conventional focusing ion beam apparatus.
Figure 2:
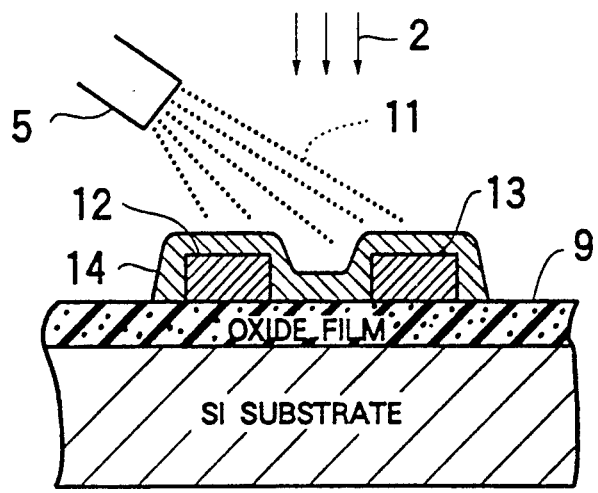
FIGS. 2 and 3 are respectively cross sections of semiconductor devices as samples.
Figure 3:
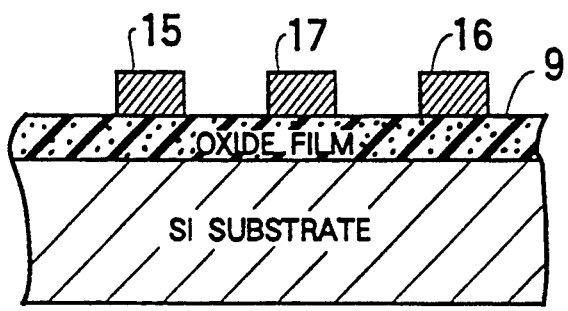

Hereinafter, embodiments of the present invention will be described with reference to the drawings. First, an embodiment of a focusing ion beam apparatus will be described, then a method of depositing an insulating film using the focusing ion beam apparatus will be referred to.

FIG. 4 is a compositional diagram of a focusing ion beam apparatus as a first embodiment of the present invention.

A sample table 22 is disposed in a sample room 20, and a sample 24 is placed on the sample table 22.

To the upper portion of the sample room 20, an ion optical tube 26 is attached. Further, in the ion optical tube 26 are disposed mass separators 27 for separating a specific ion from ions obtained by an ion source 29. The selected ion is changed into a focused ion beam 38, then irradiated on the sample 24. Moreover, a nozzle 28 as gas introducing means for spraying a gaseous tetramethoxysilane ($Si(OCH_8)_4$) as a silicon compound gas and an oxygen ($O_2$) gas as a gas mainly consisting of oxygen onto the sample 24 is provided at the sample room 24.

Reference numeral 30 designates a gas cylinder of the silicon compound gas as a gas supply source of a first gas, while 32 designates a gas cylinder of the $O_2$ gas mainly consisting of oxygen as a gas supply source of a second gas. These are provided at the exterior of the sample room 20. These gases supplied from the gas supply sources are mixed at a mixing valve 34, then sprayed onto the surface of the sample 24 from the nozzle 28. The mixing valve 34, nozzle 28 and an introducing path 35 from gas cylinder 30 and 32 to nozzle 28, above descrived, are called gas introducing means.

At the upper portion of the ion optical tube 26, an ion source 29 is provided. An ion source material, for example, a silicon-gold alloy or a silicon-gold beryllium alloy, and an ion source material including a similar element to that contained in an insulating deposited film, such as an oxygen ion, are placed in the ion source 29. To the ion source materials in the ion 29, an electric field is applied to generate a metal and a gaseous ion. Then, the ions generated are deflected by an electric field of the $E \times B$ mass separator 27 to separate a silicon ion and an oxygen ion to be used, thereafter the separated silicon and oxygen ions are returned to the irradiation axis by a magnetic field of the separator 27 to form an ion beam 38 to be irradiated onto a predetermined portion of the sample 24.

Though the gas introducing means as mentioned above is so composed as to supply a mixed gas onto the sample 24 from the nozzle 28 by mixing gases from a plurality of the gas supply sources through the mixing gas valve in the embodiment, it is possible to compose it so that a plurality of gases are supplied onto the sample 11 from a plurality of nozzles corresponding to the respective gas supply sources. The composition is particularly effective in case that a plurality of gases to be supplied onto the sample are reactive when mixed.

Next, a method of depositing an insulating film which is a second embodiment of the present invention will be described with reference to the FIB apparatus of the above embodiment.

The sample 24 of a semiconductor device is set on the sample table 22 in the sample room 20. Then, a mixed gas 36 of the silicon compound gas and the gas mainly consisting of oxygen respectively from the gas cylinders 30 and 32 as gas supply sources is sprayed onto the sample 24 through the nozzle 28. Moreover, the focusing silicon (Si) ion beam 38 from the ion source 29 in the ion optical tube 26 is irradiated thereon.

Thereby, the silicon compound gas sprayed from the nozzle 28 is absorbed on the surface of the sample 24. Further, the Si focusing ion beam 38 is irradiated thereon, and the silicon compound gas is decomposed into silicon and other compounds. Oxygen (O) contained in the gas mainly consisting of oxygen sprayed at the same time and silicon Si are combined with each other, so that a film 44 consisting of a silicon oxide ($SiO_x$) is selectively deposited on the surface of wires 42 on a substrate 40 as shown in FIG. 5.

In the method of depositing an insulating film in the embodiment, the degree of vacuum in the sample room 20 is $10^{-5}$ Torr. The nozzle 28 is so arranged that the distal end thereof is spaced 0.5 mm from the surface of the substrate 40. While, the mixed gas to be sprayed on the substrate consists of tetramethoxysilane ($Si(OCH_3)_4$) as the silicon compound gas and an oxygen ($O_2$) gas as the gas mainly consisting of oxygen at a ration of 1:1.

As the ion source 29, a silicon-gold alloy ion source is used. Further, the silicon ion beam generated by fusing the ion source is irradiated onto the surface of the wire 42 on the substrate 40 for 0.5 hours at a beam current of 0.2 nA.

As the result, the deposited layer 44 formed on the surface of the wire 42 on the substrate 40 has a width of 10 $\mu$m and a thickness of 0.1 $\mu$m.

Figure 6:
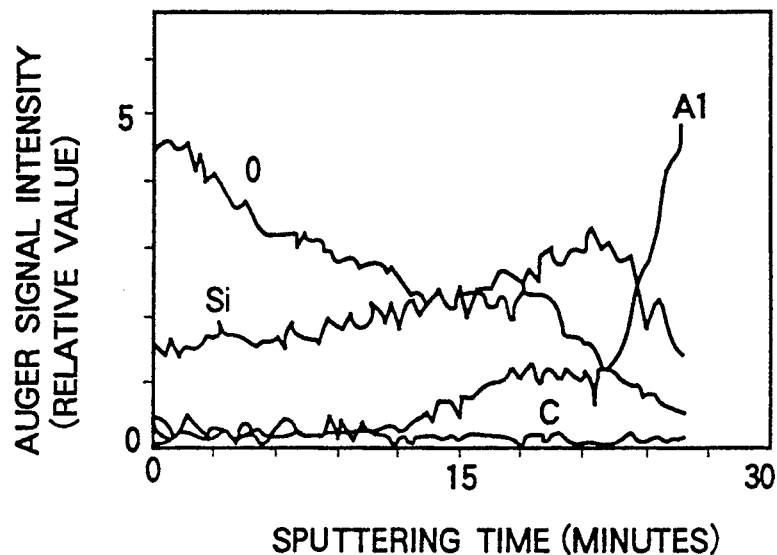
FIG. 6 is a diagram to show a result of a constituent analysis of a deposited film on the semiconductor device shown in FIG. 5.
Figure 7:
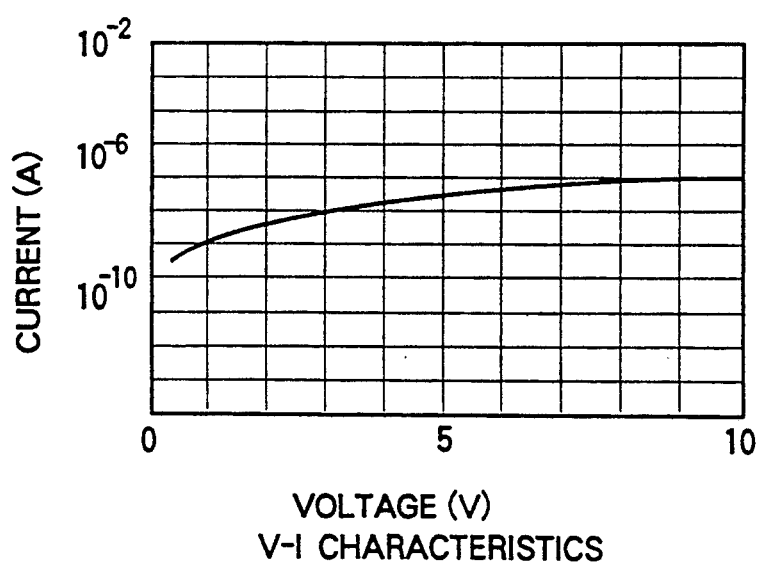
FIG. 7 is a V-I characteristic diagram of the deposited film of the semiconductor device shown in FIG. 5.

An analysis result in the depth direction of the deposited film 44 on $\mu$-AES obtained by a micro-auger analyzer is shown in FIG. 6. From the same diagram, it is seen that the deposited film 44 consists of silicon (Si) and oxygen (O), thus the film is a silicon oxide ($SiO_x$) film. Moreover, a measurement result of a V-I characteristic diagram of the deposited film 44 is shown in FIG. 7. In this case, the deposited film 44 has a thickness of 0.1 $\mu$m and a width of 7 $\mu$m. From the same diagram, it is seen that when the voltage V is below 5 V, the current is below $10^{-7}$ A, and the specific resistance is above 2.5M$\Omega$·cm, thus the film satisfies the conditions as an insulating film.

Generally, the insulating film in the IC repair is required to have a specific resistance above 1.0M$\Omega$·cm and a pressure resistance above 10 v. The silicon oxide film as the deposited film 44 obtained by the embodiment satisfies the standard enough.

On the insulating film obtained as mentioned above, a tungsten (W) layer 46 is deposited on the substrate 40 in accordance with the conventional method, thereby connecting between wires 50 and 52 over the insulating film 44 on the intermediate wire 42. Accordingly, even in case that the wire 42 not to be connected is present between the wires 50 and 52, the wires 50 and 52 can be connected to each other without causing the problem as mentioned above in the prior art.

When a gas mainly consisting of nitrogen, such as a nitrogen monoxide ($N_2O$) gas and an ammonia ($NH_3$) gas, is used in place of the gas mainly consisting of oxygen which is sprayed with the silicon compound gas as a mixed gas 54 onto the surface of the semiconductor substrate 40 as a sample 48, a deposited film can be also formed on the surface of the wire 42 of the substrate 40 under the same conditions as in the embodiment. The deposited film is a silicon nitride ($SiN_x$) film, and has a high insulating property similar to the silicon oxide insulating film.

Examples used in place of tetramethoxysilane (Si-$(OCH_3)_4$) as the silicon compound gas include tetraethoxysilane ($Si(OC_2H_5)_4$), tetramethylsilane ($Si(CH_3)_4$), dimethoxydimethylsilane ($Si(CH_3)_2(OCH_3)_2$) and hexamethyldisiloxane ($[(Si(CH_3)_3)]_2O$).

Moreover, the example may be a mixed gas of these silicon compound gases.

While, examples as the gas mainly consisting of oxygen for forming the silicon oxide in place of the oxygen gas include an ozone ($O_3$) gas and a mixed gas of an ozone gas and an oxygen gas.

While, examples as the gas mainly consisting of nitrogen for forming the silicon nitride in place of the nitrogen monoxide gas and the ammonia gas include a nitrogen ($N_2$) gas and a mixed gas of the nitrogen gas, a nitrogen monoxide gas and an ammonia gas.

Moreover, examples in place of the silicon-gold alloy as the ion source include a silicon alloy, such as a silicon-gold-beryllium alloy, and an oxygen ion source. By using these ion sources, contamination of the insulating film to be formed by impurities can be prevented, thus the insulating property can be improved. Moreover, other elements, for example boron (B), phosphrus (P) and indium (In), may be used as the ion source to improve the insulating property of the insulating film to be formed.

Figure 8:
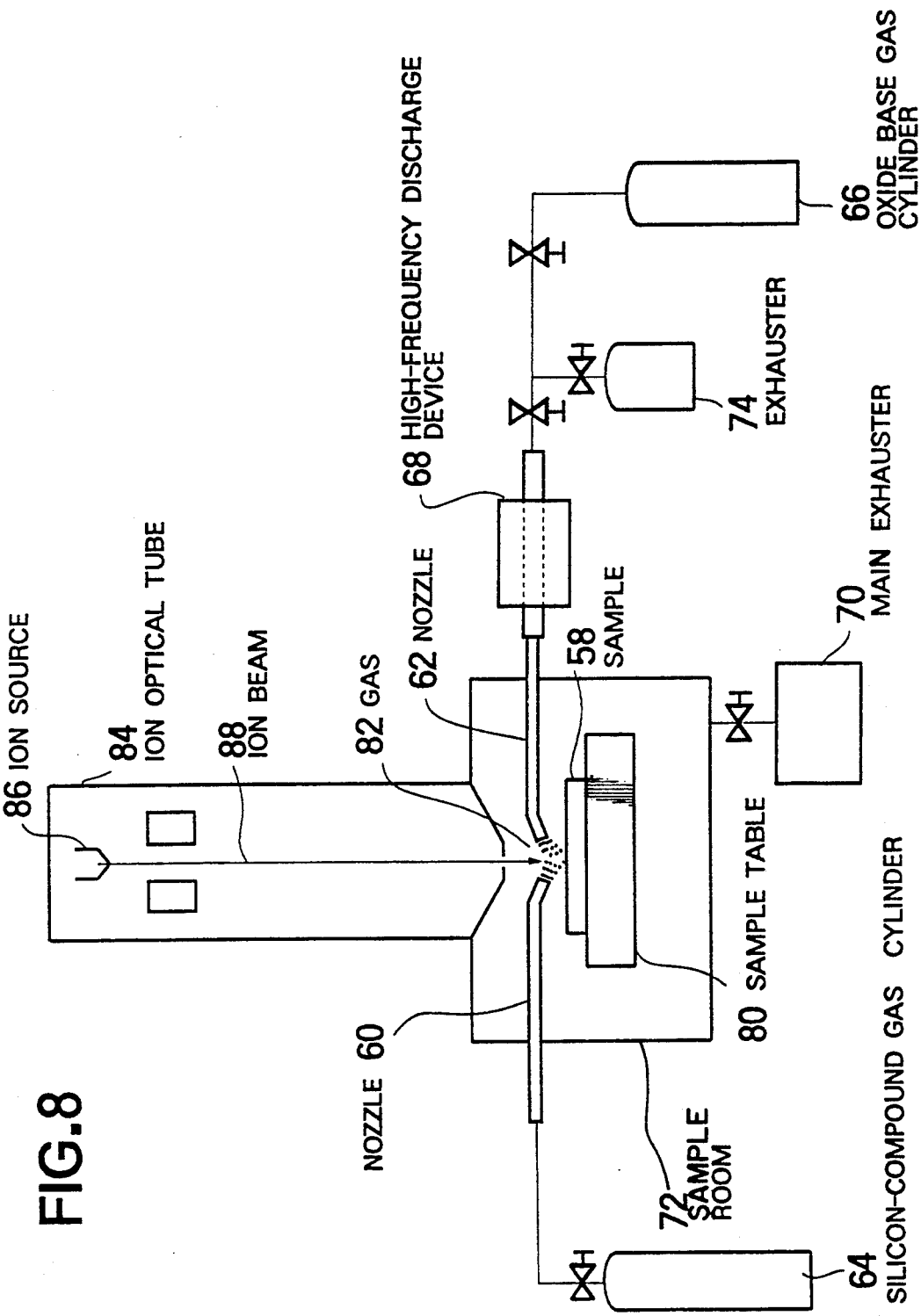
FIG. 8 is a compositional diagram of a focusing ion beam apparatus which is a third embodiment of the present invention.

FIG. 8 is a compositional diagram of a focusing ion beam apparatus which is a third embodiment of the present invention. In the same diagram, nozzles 60 and 62 are arranged above a sample 58 so that these nozzles are respectively spaced 0.5 mm from the sample 58 as similar to the focusing ion beam apparatus described in the first embodiment. The nozzle 60 supplies a silicon compound gas as a first gas to the surface of the sample 58 from a gas cylinder 64. While, the nozzle 62 supplies a gas mainly consisting an element other than silicon, for example oxygen, as a second gas to the surface of the sample 58. Moreover, the silicon gas and the gas mainly consisting of an element other than silicon for forming a silicon compound insulating film with the silicon compound are supplied on the surface of the sample 58 separately and simultaneously through the nozzles 60 and 62. As an intermediate portion of gas introducing means from a gas cylinder 66 to the nozzle 62, a high-frequency discharge apparatus 68 for energetically activating the gas mainly consisting of oxygen to form a radical thereof is provided.

Reference numeral 70 designates a main exhauster apparatus for exhausting the interior of the sample room 72, and 74 is an exhauster for exhausting the gas mainly consisting of oxygen.

Figure 9:
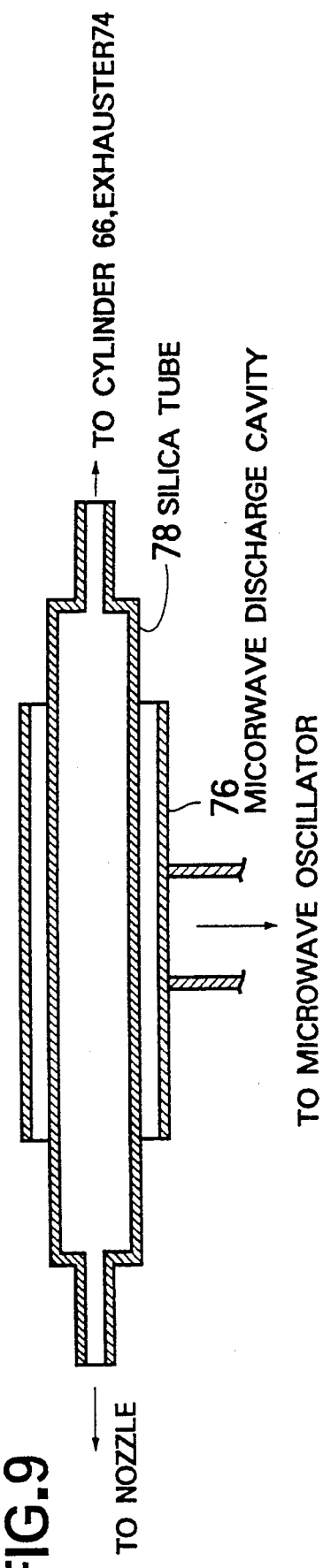
FIG. 9 is a compositional diagram of a high-frequency discharge apparatus which is a compositional element of the focusing ion beam apparatus shown in FIG. 8.

As specifically shown in FIG. 9, the high-frequency discharge apparatus 68 comprises a cylindrical microwave discharge cavity 76 and a slilica tube 78 inserted in the cavity 76. Further, the cavity 76 is connected to a microwave oscillator (not shown), while an end of the silica tube 78 is connected to the nozzle 62, and the other end is connected to piping on the side of the gas cylinder 66 and the exhauster 74. Thus, the nozzle 62 introduces a gas for forming a silicon compound insulating film, that is, the gas mainly consisting of an element other than silicon for forming, such as an oxygen gas and a nitrogen gas into the silica tube 78 from the gas cylinder 66. Then, the element other than silicon contained in the gas introduced is energetically activated into a radical in the silica tube 78 by high-frequency discharge, and the radical is supplied onto the surface of the sample 58.

Next, a method of depositing an insulating film which is a fourth embodiment will be described with reference to the FIB apparatus of the present invention having the above composition.

Figure 10:
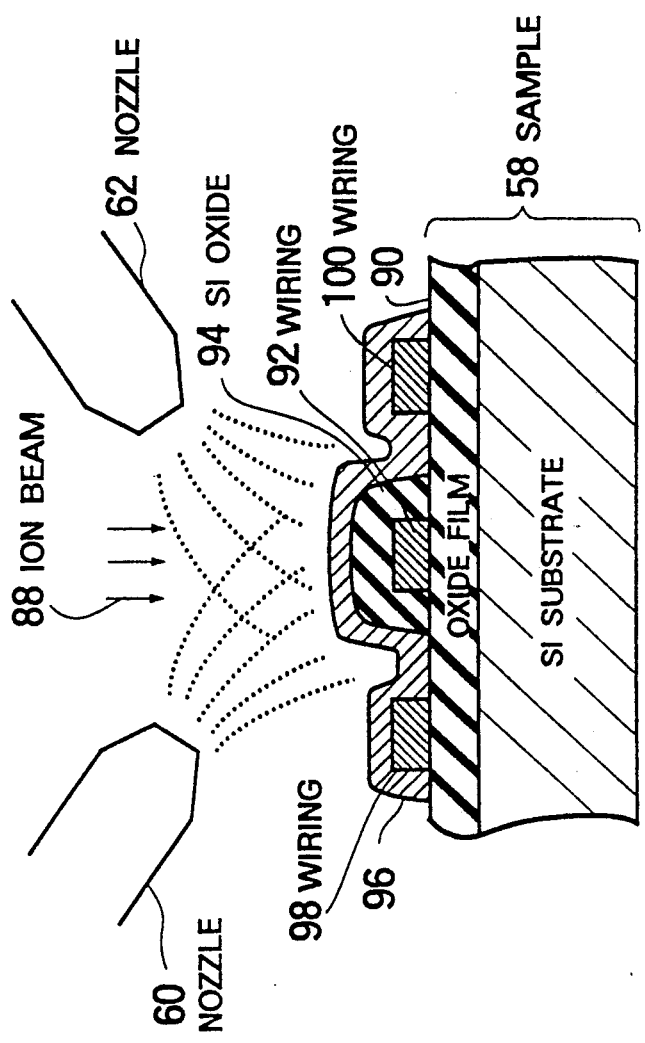
FIG. 10 is a cross section of a semiconductor device obtained by using the focusing ion beam apparatus shown in FIG. 8.

As shown in FIGS. 8 and 10, the sample 58 of a semiconductor is set on a sample table 80 in the sample room 72, then a silicon compound gas is sprayed onto the surface of the sample 58 through the nozzle 60 from the gas cylinder 64 as a gas supply source. Moreover, an oxygen gas supplied from the gas cylinder 66 as a supply source of a gas mainly consisting of oxygen is supplied into a high-frequency discharge apparatus 68. Then, an oxygen radical is generated in the discharge apparatus 68, thereafter a gas containing the oxygen radical is sprayed onto the surface of the sample 58 through the nozzle 62. Moreover, a silicon focusing ion beam 88 obtained from an ion source 86 of an ion optical tube 84 is irradiated onto the surface of the sample 58, where a mixed gas 82 of these gases are present.

Thereby, silicon atoms present at the surface of the sample 58 are excited by the ion beam 88. The silicon compound gas is sprayed onto the sample 58 from the nozzle 60, then the gas is decomposed into silicon and others. As the result, the silicon generated by the decomposition is absorbed to the surface of the sample 58. Thereafter, the highly reactive oxygen radical generated by the discharge apparatus 68 is sprayed onto the surface of the sample 58, and combined with the silicon absorbed thereto. Thus, an insulating film 94 consisting of a silicon oxide ($SiO_x$) is selectively deposited on the surface of a naked wire 92 on a semiconductor substrate 90 as the sample 58 as shown in FIG. 10.

In the method of depositing an insulating film in the embodiment, diameters of the openings of the nozzles 60 and 62 in the FIB apparatus are commonly 200 $\mu$m, and spaces of the respective distal ends of the nozzles 60 and 62 to the surface of the sample 58 are commonly set at 0.5 mm. Moreover, the degree of vacuum in the sample room 72 is kept at $10^{-5}$ Torr by the main exhauster 70.

As the silicon compound gas, a tetramethoxysilane gas ($Si(OCH_3)_4$) is used, and is sprayed onto the surface of the sample 58 through the nozzle 60 from the gas cylinder 64. Also, as shown in FIG. 9, the oxygen gas is flowed from the gas cylinder 66 of a gas mainly consisting of oxygen into the silica tube 78 of the discharge apparatus 68, then the gas is energetically activated by the high-frequency discharge to form an oxygen radical. Thereafter, the radical is sprayed onto the surface of the sample 58.

As the ion source 86, a silicon-gold alloy ion source is used. The ion source is fused to generate the silicon ion beam 88, then the ion beam 88 is irradiated onto the surface of the wire 92 for 10 minutes at a beam current of 0.2 nA.

As the result, the insulating film 94 formed on the surface of the wire 92 of the sample 58 has a width of 10 $\mu$m and a thickness of 0.1 $\mu$m.

From the constituent analysis result of the deposited film 94 by the micro-auger analyzer, it is seen that a silicon dioxide film is formed substantially stoichiometrically. While, the specific resistance of the deposited film 94 is over 5M$\Omega$·cm, so that the insulating film has a preferable insulating property to the case that the high-frequency discharge is not used.

Also, in the method of depositing an insulating film in the embodiment, examples used as the gas to be sprayed onto the surface of the semiconductor substrate 90 as the sample 58 in place of the gas mainly consisting of oxygen as a gas mainly consisting of an element other than silicon for forming a silicon compound gas and a silicon compound insulating film include a gas mainly consisting of nitrogen, such as a nitrogen gas ($N_2$) and an ammonia gas ($NH_3$) to form an insulating film on the surface of the wire 92 as mentioned in the second embodiment. When the gas mainly consisting of nitrogen is used, an insulating film to be obtained is a film of a silicon nitride ($Si_3N_4$), and the film has a high insulating property as similar to the insulating film of a silicon oxide.

While, examples of the silicon compound gas used in place of tetramethoxysilane ($Si(OCH_3)_4$) include tetraethoxysilane ($Si(OC_2H_5)_4$), tetramethylsilane ($Si(CH_3)_4$), dimethoxydimethylsilane ($Si(CH_3)_2(OCH_3)_2$) and hexamethyldisiloxane ($[Si(CH_3)_3]_2O$).

Moreover, the example may be a mixed gas of these silicon compound gases.

Examples of the gas mainly consisting of oxygen to be used forming the silicon oxide in place of the oxygen gas include an ozone gas ($O_3$) and a mixed gas of these gases.

While, examples of the gas mainly consisting of nitrogen to be used for forming the silicon nitride in place of the nitrogen gas and the ammonia gas include a nitrogen monoxide gas ($N_2O$) and a mixed gas of these gases.

Moreover, examples as the ion source used in place of the silicon-gold alloy include a liquid metal ion source of a silicon alloy, such as a silicon-gold-beryllium alloy, and an electric field ionization gas such as ion source of oxygen and nitrogen. Additionally, an electric field ionization gas ion source of an inert gas, such as argon (Ar) and helium (He), can be also used. According to these ion sources, contamination of an insulating film to be formed by impurities can be prevented. Thus, it is also possible to use an element, for example boron (B), phosphorus (P) and indium (In) as the ion source, which can improve the insulating property of an insulating film to be formed.

Furthermore, when the silicon compound gas is formed into a radical by the high-frequency discharge means of the like to such an extent that the decomposition is not caused, the forming rate of the silicon compound insulating film on the sample can be increased.

According to the first to the fourth embodiment described above, when a tungsten (W) film 96 is deposited on the substrate 90 of the sample 58 by the generally conventional method after the deposition of the insulating film of the silicon compound, wires 98 and 100 can be connected over the insulating film 94 under which is positioned the wire 92 not to be connected. Thus, even in the case that the wire not to be connected is present at the central position, the wires 98 and 100 on both the sides can be connected without causing the problem in the prior art as mentioned above.

Next, an embodiment of the IC repair apparatus which can be obtained by using the focusing ion beam apparatus of the embodiment stated above will be described.

Figure 11:
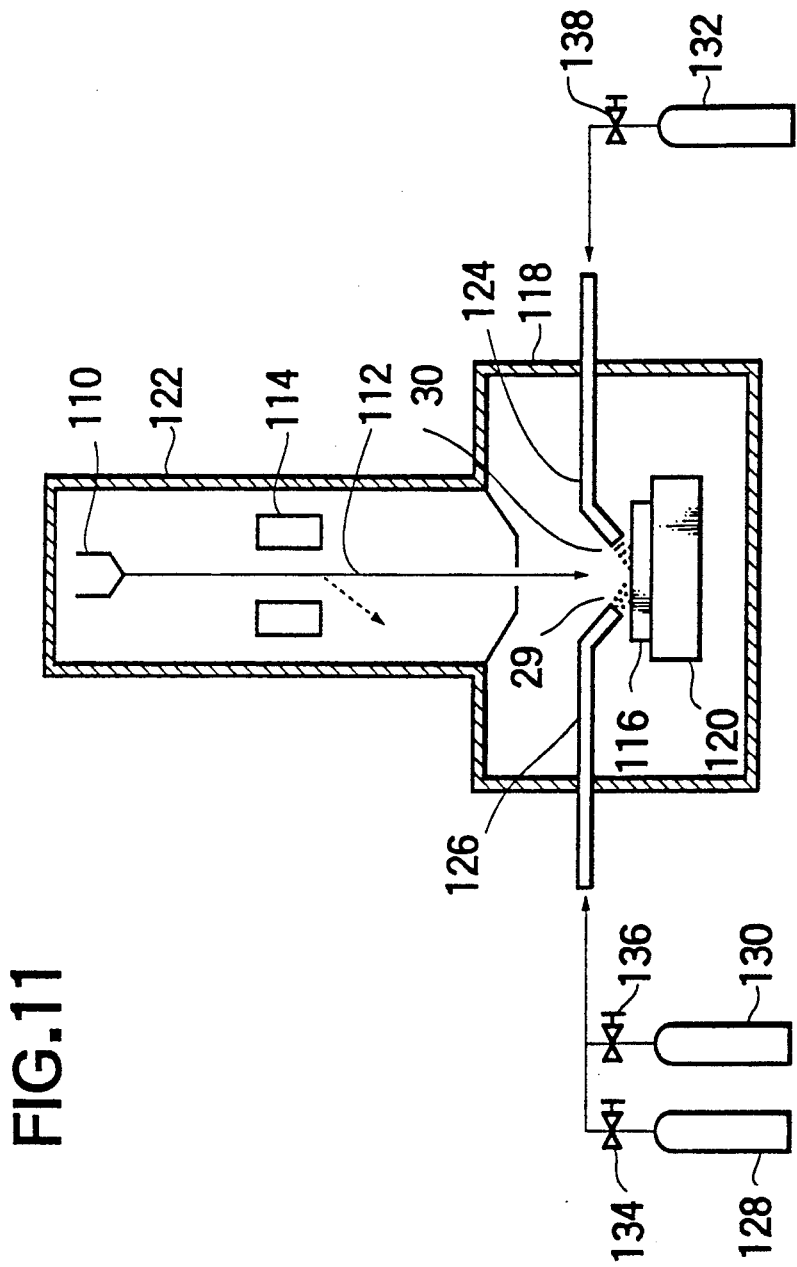
FIG. 11 is a focusing ion beam IC repair apparatus in which the focusing ion beam apparatus of FIGS. 4 and 8 are incorporated.

FIG. 11 is a schematic diagram of a IC repair apparatus which is a fifth embodiment of the present invention. In the same diagram, ions generated from a silicon-gold alloy ion source 110 are separated by an EXP mass separator 114 to obtain desired ions 112, then the ions 112 is irradiated onto a sample 116. While, the sample 116 is placed on a sample table 120 disposed in a sample room 118.

At the upper portion of the sample room 118, an ion optical tube 122 including the ion source 110 and the mass separator 114 and irradiating a focusing ion beam is integrally attached. Further, nozzles 124 and 126 are provided at the sample room 118. The nozzles are respectively gas introducing means for spraying a gas for depositing a metal thin film, for example a tungsten carbonyl ($W(CO)_6$) gas, and a silicon compound gas for depositing an insulating film, for example tetramethoxysilane ($Si(OCH_3)_4$) and an oxygen gas, on to the sample 116. Reference numerals 128, 130 and 132 respectively designate gas cylinders of tetramethoxysilane, oxygen and $W(CO)_6$, and 134, 136 and 138 respectively designate opening and closing valves.

In the focusing ion beam IC repair apparatus (hereinafter, called IC repair apparatus) having the above-mentioned composition, a gold ion is selected by the mass separator 114 from the ions generated from the ion source 110, then is irradiated onto an area on the sample 116, in which is included a wire to be cut.

To deposit a metal thin film on the sample 116, a $W(CO)_6$ gas is sprayed on the sample 116 from the nozzle 124, at the same time a gold ion is selected by the mass separator 114 and is irradiated onto an optional area of the sample 116 to which the metal thin film is to be deposited. Thus, the $W(CO)_6$ gas is decomposed, and W is generated therefrom so that a W film can be deposited on the sample 116. Thereby, the connection between desired wires can be carried out.

While, to deposit an insulating film on the sample 116, an $Si(OCH_3)_4$ gas and an oxygen gas are sprayed on the sample 116 from the nozzle 126, at the same time a silicon ion from the ion source 110 is selected by the mass separator 114 and is irradiated onto an optional area of the sample 116 to which the insulating film is to be deposited. Thus, the $Si(OCH_3)_4$ gas is decomposed so that an insulating film, such as a silicon oxide film, can be formed.

Referring to FIG. 5 again, also according to the IC repair apparatus of the embodiment, the wires 50 and 52 can be selectively and easily connected with insulating the wire 42 even when the wire 42 is present between the wire 50 and 52. Namely, in FIG. 11, the $Si(OCH_3)_4$ gas and the oxygen gas are sprayed onto the sample 116 from the nozzle 126 as stated above, while the silicon ion is selected by the mass separator 114 from ions generated from the ion source 110, then irradiated onto the area designated the wire 42 shown in FIG. 5 of the sample 116 to completely coat the wire 42 with a silicon oxide film. Then, as described in the second and the fourth embodiment, the gas system shown in FIG. 11 is changed, and the W(CO)$_6$ gas is sprayed onto the sample 116, while a gold ion is selected by the mass separator 114 from ions generated from the ion source 110, then is irradiated onto the area over the wires 50 and 52 shown in FIG. 5 on the sample 116. Thus, the W film can be formed at the selected portion to connect both the wires 50 and 52.

Also, according to the IC repair apparatus of the embodiment, it is possible to form an insulating film over a portion in which wires cut to be checked are present.

As described above, according to the IC repair apparatus of the embodiment, it is easy to cut or connect optional portions of wires and selectively form an insulating film onto a desired portion of the surface of a sample. Accordingly, a fine process of a circuit in a semiconductor device can be easily carried out, so that the operational analysis and the defective check on the semiconductor device can be carried out over a relatively wide range at the development stage thereof;

Additionally, according to the IC repair apparatus of the embodiment, a method of depositing an insulating film can be carried out as similarly shown in the second and the fourth embodiment.

As the alloy ion source, a silicon-gold-beryllium alloy can be used in place of the silicon-gold alloy.

As the oxygen gas for forming the silicon oxide together with the silicon compound gas, a gas mainly consisting of oxygen can be used instead.

Moreover, a gas mainly consisting of nitrogen can be also used in place of the oxygen gas or the gas mainly consisting of oxygen to form a silicon nitride.

Various modifications will become possible for those skilled in the art after receiving the teachings of the present disclosure without departing from the scope thereof.

What is claimed is:

1. A method of depositing an insulating film on the surface of a sample, comprising:
    a step of supplying a first gas consisting of a silicon compound selected from the group consisting of tetramethoxysilane, tetraethoxysilane, tetramethylsilane, and dimethoxydimethylsilane, hexamethyldisiloxane, and mixtures thereof onto the surface of the sample placed in a vacuum environment;
    a step of supplying a second gas predominatly comprising an element other than silicon onto the surface of the sample; and
    a step of depositing a silicon compound insulating film on the surface of the sample by reaction of the first gas and the second gas generated from irradiating an ion beam obtained from an ion source including an element for composing the insulating film onto the surface of the sample.

2. A method of depositing an insulating film according to claim 1, wherein
    the step of supplying the first gas is a step of supplying a radical of a silicon compound gas as the first gas; and
    the step of supplying the second gas is a step of supplying a radical of a gas of an element other than silicon as the second gas.

3. A method of depositing an insulating film according to claim 1, wherein
    the step of depositing the silicon compound insulating film is a step of using a liquid metal ion source as the ion source.

4. A method of depositing an insulating film according to claim 1, wherein
    the step of depositing the silicon compound insulating film is a step of using an active-gas electric field ionization ion source as the ion source.

5. A method of depositing an insulating film according to claim 1, wherein
    the step of depositing the silicon compound insulating film is a step of using an inert-gas electric field ionization ion source as the ion source.

6. A method of depositing an insulating film according to claim 1, wherein
    the step of supplying the first gas is a step of using tetramethoxysilane as the first gas.

7. A method of depositing an insulating film according to claim 1, wherein
    the step of supplying the first gas is a step of using tetraethoxysilane as the first gas.

8. A method of depositing an insulating film according to claim 1, wherein
    the step of supplying the first gas is a step of using tetramethylsilane as the first gas.

9. A method of depositing an insulating film according to claim 1, wherein
    the step of supplying the first gas is a step of using dimethoxydimethylsilane as the first gas.

10. A method of depositing an insulating film according to claim 1, wherein
    the step of supplying the first gas is a step of using hexamethyldisiloxane as the first gas.

11. A method of depositing an insulating film according to claim 1, wherein
    the step of supplying the first gas is a step of using a mixed gas of silicon compound gases selected from the group consisting of tetramethoxysilane, tetraethoxysilane, tetramethylsilane, dimethoxydimethylsilane and hexamethyldisiloxane, 12. A method of depositing an insulating film according to claim 1, wherein
    the step of supplying the second gas is a step of using a gas mainly consisting of oxygen as the second gas; and
    the step of depositing a silicon compound insulating film is a step of depositing a silicon oxide as the silicon compound insulating film.

13. A method of depositing an insulating film according to claim 12, wherein
    the step of supplying the second gas is a step of using an oxygen gas as the gas mainly consisting of oxygen.

14. A method of depositing an insulating film according to claim 12, wherein
    the step of supplying the second gas is a step of using an ozone gas as the gas mainly consisting of oxygen.

15. A method of depositing an insulating film according to claim 12, wherein
    the step of supplying the second gas is a step of using a mixed gas consisting of an oxygen gas and an ozone gas as the gas mainly consisting of oxygen.

16. A method of depositing an insulating film according to claim 1, wherein
    the step of supplying the second gas is a step of using a gas mainly consisting of nitrogen as the second gas; and the step of depositing an silicon compound insulating film is a step of depositing a silicon nitride as the silicon compound insulating film.

17. A method of depositing an insulating film according to claim 16, wherein
the step of supplying the second gas is a step of using a nitrogen gas as the gas mainly consisting of nitrogen.

18. A method of depositing an insulating film according to claim 16, wherein
the step of supplying the second gas is a step of using an ammonia gas as the gas mainly consisting of nitrogen.

19. A method of depositing an insulating film according to claim 16, wherein
the step of supplying the second gas is a step of using a nitrogen oxide gas as the gas mainly consisting of nitrogen.

20. A method of depositing an insulating film according to claim 16, wherein
the step of supplying the second gas is a step of using a mixed gas of gases selected from the group consisting of a nitrogen gas, an ammonia gas and a nitrogen oxide gas as the gas mainly consisting of nitrogen.

21. A method of depositing an insulating film on the surface of a sample, comprising:
a step of activating a first gas selected from the group consisting of tetramethoxysilane, tetraethoxysilane, tetramethylsilane, and dimethoxydimethylsilane, hexamethyldisiloxane, and mixtures thereof into a radical;
a step of supplying said radical to a sample room kept at a vacuum environment and containing a sample;
a step of supplying a second gas mainly consisting of an element other than silicon onto the surface of the sample; and
a step of depositing a silicon compound insulating film on the surface of the sample by reaction of the first gas and the second gas generated from irradiating an ion beam obtained from an ion source including an element for composing the insulating film onto the surface of the sample.

22. A method according to claim 21, wherein the second gas is also activated into a radical outside the sample room, and then provided onto the sample in the sample room for the step of depositing the silicon compound insulating film.

* * * * *